United States Patent
Lu et al.

(10) Patent No.: US 12,001,113 B2
(45) Date of Patent: Jun. 4, 2024

(54) DISPLAY SUBSTRATE HAVING ELECTROCHROMIC STRUCTURE WITH CHANGEABLE TRANSMITTANCE, DISPLAY APPARATUS AND DISPLAY METHOD THEREFOR

(71) Applicant: BOE Technology Group Co., Ltd., Beijing (CN)

(72) Inventors: Yanhui Lu, Beijing (CN); Kang Guo, Beijing (CN); Xiao Zhang, Beijing (CN); Duohui Li, Beijing (CN); Xueyuan Zhou, Beijing (CN); Mengya Song, Beijing (CN); Jin Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/920,748

(22) PCT Filed: Jun. 1, 2021

(86) PCT No.: PCT/CN2021/097625
§ 371 (c)(1),
(2) Date: Oct. 21, 2022

(87) PCT Pub. No.: WO2021/244514
PCT Pub. Date: Dec. 9, 2021

(65) Prior Publication Data
US 2023/0168558 A1    Jun. 1, 2023

(30) Foreign Application Priority Data
Jun. 5, 2020 (CN) .......................... 202010504696.7

(51) Int. Cl.
*G02F 1/163* (2006.01)
*G02F 1/1335* (2006.01)
(Continued)

(52) U.S. Cl.
CPC ........ *G02F 1/163* (2013.01); *G02F 1/133528* (2013.01); *G02F 1/155* (2013.01);
(Continued)

(58) Field of Classification Search
CPC .... G02F 1/157; G02F 1/133528; G02F 1/163; G02F 1/155; G02F 1/137; G02F 2201/44;
(Continued)

(56) References Cited

U.S. PATENT DOCUMENTS

| | | | | |
|---|---|---|---|---|
| 2006/0132424 A1* | 6/2006 | Foo | ..................... | G02F 1/13318 345/102 |
| 2013/0328755 A1* | 12/2013 | Al-Dahle | ............. | G09G 3/3677 345/87 |
| 2021/0335294 A1 | 10/2021 | Wang et al. | | |

FOREIGN PATENT DOCUMENTS

| CN | 101833932 A | 9/2010 |
|---|---|---|
| CN | 107507854 A | 12/2017 |

(Continued)

OTHER PUBLICATIONS

CN202010504696.7 first office action.
CN202010504696.7 second office action.
PCT/CN2021/097625 international search report.

*Primary Examiner* — Yaron Cohen
(74) *Attorney, Agent, or Firm* — IPro, PLLC (57) ABSTRACT

Provided are a display substrate, a display apparatus and a display method therefor. The display substrate includes: a base substrate; pixel units on the base substrate; and an electrochromic structure on a side of the pixel units that is away from the base substrate. The transmittance of the electrochromic structure is positively correlated with the brightness of the pixel units when displaying an image, such that the contrast of the display substrate is improved, and the display effect is improved.

11 Claims, 5 Drawing Sheets

(51) Int. Cl.
     *G02F 1/137*   (2006.01)
     *G02F 1/155*   (2006.01)
     *G02F 1/157*   (2006.01)
     *G09G 3/20*    (2006.01)
     *G09G 3/38*    (2006.01)
     *H10K 59/50*   (2023.01)

(52) U.S. Cl.
     CPC ............ *G02F 1/157* (2013.01); *G09G 3/2007* (2013.01); *G09G 3/38* (2013.01); *H10K 59/50* (2023.02); *G02F 1/137* (2013.01); *G02F 2201/44* (2013.01); *G02F 2201/52* (2013.01); *G09G 2320/0626* (2013.01); *G09G 2320/066* (2013.01); *G09G 2360/16* (2013.01)

(58) Field of Classification Search
     CPC .. G02F 2201/52; G02F 1/133502; G02F 1/15; H10K 59/50; G09G 3/38; G09G 3/2007; G09G 2320/066; G09G 2320/0271; G09G 3/20; G09G 2360/16; G09G 2320/0626
     See application file for complete search history.

(56) References Cited

FOREIGN PATENT DOCUMENTS

| | | | |
|---|---|---|---|
| CN | 110320723 | A | 10/2019 |
| CN | 111552133 | A | 8/2020 |
| KR | 20200049399 | A | 5/2020 |

\* cited by examiner

DISPLAY SUBSTRATE HAVING ELECTROCHROMIC STRUCTURE WITH CHANGEABLE TRANSMITTANCE, DISPLAY APPARATUS AND DISPLAY METHOD THEREFOR

CROSS REFERENCE TO RELATED APPLICATIONS

The present disclosure is a national phase entry under 35 U.S.C. § 371 of International Application No. PCT/CN2021/097625, filed on Jun. 1, 2021, which claims priority of Chinese Patent Application No. 202010504696.7, filed with the China National Intellectual Property Administration on Jun. 5, 2020 and entitled "DISPLAY SUBSTRATE, DISPLAY APPARATUS AND DISPLAY METHOD THEREFOR", the entire contents of which are incorporated herein by reference.

FIELD

The present disclosure relates to the technical field of display, in particular to a display substrate, a display apparatus and a display method therefor.

BACKGROUND

With the development and progress of science and technology, functions of display apparatuses become more and more diversified. For example, a mirror display apparatus has both the mirror and display functions.

At present, the following two methods are mainly adopted to realize the mirror display. One is that a metal electrode of an organic light-emitting diode (OLED) display is used as a reflective layer to realize the mirror display, for example, an anode is used as a reflective electrode. The other is that upper polarized light of a liquid crystal display (LCD) adopts metal linearly polarized light with a reflective effect to realize the mirror display.

SUMMARY

In a first aspect, embodiments of the present disclosure provide a display substrate, including:

a base substrate;

a plurality of pixel units, wherein the plurality of pixel units are located on the base substrate; and an electrochromic structure, wherein the electrochromic structure is located on one side of the plurality of pixel units facing away from the base substrate, and transmittance of the electrochromic structure is positively correlated with brightness of the plurality of pixel units when displaying an image.

In a possible implementation, the electrochromic structure includes a plurality of electrochromic units, the plurality of pixel units are in one-to-one correspondence to the plurality of electrochromic units, and transmittance of each electrochromic unit is positively correlated with brightness of the corresponding pixel unit when displaying the image.

In a possible implementation, the electrochromic unit includes a first electrode and a second electrode arranged sequentially facing away from the base substrate, and an electrochromic film arranged between the first electrode and the second electrode.

In a possible implementation, the electrochromic film includes an ion layer, an electrochromic layer and an electrolyte layer arranged sequentially facing away from the base substrate.

In a possible implementation, the plurality of pixel units are of a liquid crystal display structure, the display substrate further includes a metal linear polarizer, and the metal linear polarizer is located between the liquid crystal display structure and the electrochromic structure.

In a possible implementation, the plurality of pixel units are OLED devices, the display substrate further includes an encapsulation layer located on a surface of the OLED devices facing away from the base substrate, and the electrochromic structure is located on one side of the encapsulation layer facing away from the base substrate.

In a second aspect, embodiments of the present disclosure provide a display apparatus, including any above display substrate and a processor, wherein the processor is configured to:

receive an image;

determine brightness of a plurality of pixel units when displaying the image; and determine a pulse voltage applied to an electrochromic structure according to the brightness, and adjust transmittance of the electrochromic structure under an action of the pulse voltage.

In a third aspect, embodiments of the present disclosure provide a display method of the above display apparatus, including:

receiving an image when the display apparatus is in a display state;

determining brightness of a plurality of pixel units when displaying the image; and determining a pulse voltage applied to an electrochromic structure according to the brightness, and adjusting transmittance of the electrochromic structure under an action of the pulse voltage.

In a possible implementation, the adjusting the transmittance of the electrochromic structure, includes:

determining a scene where the display apparatus is currently located;

determining a gray level conversion rule of the plurality of pixel units when displaying the image according to the scene;

determining a gray level of the plurality of pixel units when displaying the image according to the gray level conversion rule and the brightness; and determining a pulse voltage applied to the electrochromic structure according to the gray level, and adjusting transmittance of the electrochromic structure under an action of the pulse voltage.

The determining the gray level conversion rule of the plurality of pixel units when displaying the image according to the scene, includes:

if the scene is an indoor environment, the gray level conversion rule is:

$$0.299R+0.587G+0.114B=GRAY(Y);$$

where, R represents brightness of red sub-pixels included by the plurality of pixel units, G represents brightness of green sub-pixels included by the plurality of pixel units, B represents brightness of blue sub-pixels included by the plurality of pixel units, and GRAY(Y) represents the gray level of the plurality of pixel units when displaying the image.

In a possible implementation, the determining the gray level conversion rule of the plurality of pixel units when displaying the image according to the scene, includes:

if the scene is an outdoor environment, the gray level conversion rule is:

$$[\max(R,G,B)+\min(R,G,B)]/2=GRAY(Y);$$

where, R represents brightness of red sub-pixels included by the plurality of pixel units, G represents brightness of green sub-pixels included by the plurality of pixel units, B represents brightness of blue sub-pixels included by the plurality of pixel units, and GRAY(Y) represents the gray level of the plurality of pixel units when displaying the image.

In a possible implementation, the determining the scene where the display apparatus is currently located, includes:

determining a scene artificially set for the display apparatus; or determining a scene where the display apparatus is currently located according to environment parameter information where the display apparatus is currently located.

DETAILED DESCRIPTION OF THE EMBODIMENTS

To make the objectives, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are only a part of the embodiments of the present disclosure, not all of the embodiments. The embodiments in the present disclosure and features in the embodiments can be combined with each other in the case of not conflicting. Based on the described embodiments of the present disclosure, all other embodiments obtained by those of ordinary skill in the art without creative work shall fall within the protection scope of the present disclosure.

Unless otherwise defined, technical or scientific terms used in the present disclosure shall have the ordinary meanings understood by those of ordinary skill in the art to which the present disclosure pertains. The words "comprise" or "include" and the like used in the present disclosure indicate that an element or item appearing before such word covers listed elements or items appearing after the word and equivalents thereof, and does not exclude other elements or items.

It needs to be noted that the sizes and shapes of all figures in the accompanying drawings do not reflect true scales, and are only intended to schematically illustrate the content of the present disclosure. The same or similar reference numerals represent the same or similar elements or elements with the same or similar functions.

In order to ensure a mirror function of a mirror display apparatus, a reflective layer used for the mirror function usually has a high reflectivity. When the mirror display apparatus is in a display state, the high reflectivity of the reflective layer will lead to a poor display effect and a low contrast of the mirror display apparatus, and the most significant phenomenon is that there is no dark state.

How to increase the contrast of the mirror display apparatus and improve the display effect becomes an urgent technical problem to be solved.

In the related art, the contrast of the mirror display apparatus in the display state is reduced due to the reflection of ambient light. At present, a layer of antireflection material is made on the mirror display apparatus, when the mirror display apparatus is in the display state, transmittance of the antireflection material is adjusted as a whole, so that the reflection of the ambient light is reduced as a whole, and thus the display effect of the mirror display apparatus is improved. However, the overall brightness of the mirror display apparatus is reduced while the reflection of the ambient light is reduced as a whole, and the display contrast is still very low.

In view of this, embodiments of the present disclosure provide a display substrate, a display apparatus and a display method therefor, which are used for increasing the contrast of the mirror display apparatus and improving the display effect.

Figure 1:
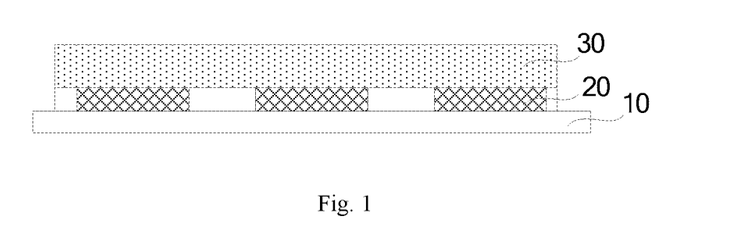
FIG. 1 is a schematic structural diagram of a display substrate provided by an embodiment of the present disclosure.

As shown in FIG. 1, which is a schematic structural diagram of a display substrate provided by an embodiment of the present disclosure. The mirror display apparatus includes:

a base substrate 10, a plurality of pixel units 20, wherein the plurality of pixel units 20 are located on the base substrate 10, and an electrochromic structure 30, wherein the electrochromic structure 30 is located on one side of the plurality of pixel units 20 facing away from the base substrate 10. Transmittance of the electrochromic structure 30 is positively correlated with brightness of the plurality of pixel units 20 when displaying an image.

In embodiments of the present disclosure, the base substrate 10 may be a glass substrate, or a silicon substrate, which is not limited here.

In an implementation process, the transmittance of the electrochromic structure 30 is positively correlated with the brightness of the plurality of pixel units 20 when displaying the image. The brightness of the pixel units 20 in different regions may be different, then the transmittance of the electrochromic structure 30 corresponding to the pixel units 20 in different regions may also be different. In this way, the transmittance of the electrochromic structure 30 can be adjusted in different regions.

The transmittance of the electrochromic structure 30 is positively correlated with the brightness of the plurality of pixel units 20 when displaying the image. For example, brightness of the plurality of pixel units 20 corresponding to an electrochromic structure A at a position 'a' when displaying the image at a first moment is L1, and brightness of the plurality of pixel units 20 corresponding to an electrochromic structure A at a position 'a' when displaying the image at a second moment is L2, where, L1>L2. At the first moment, transmittance of the electrochromic structure A at the position 'a' is T1, and at the second moment, transmittance of the electrochromic structure A at the position 'a' is T2, then T1>T2. For another example, brightness of the plurality of pixel units 20 corresponding to an electrochromic structure B at a position 'b' when displaying the image at a third moment is L3, and brightness of the plurality of pixel units 20 corresponding to an electrochromic structure B at a position 'b' when displaying the image at a fourth moment is L4, where, L3<L4. At the third moment, transmittance of the electrochromic structure B at the position 'b' is T3, and at the fourth moment, transmittance of the electrochromic structure B at the position 'b' is T4, then T3<T4. In this way, a region corresponding to the electrochromic structure 30 with the adjusted transmittance is brighter in a bright part and darker in a dark part when displaying the image, so that the transmittance of the electrochromic structure 30 is adjusted in real time according to the brightness corresponding to the plurality of pixel units 20, further, the contrast of the display substrate when displaying the image is increased, and the display effect is improved.

Figure 2:
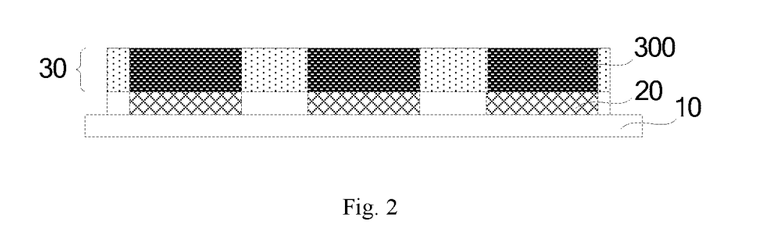
FIG. 2 is a schematic structural diagram of a display substrate provided by an embodiment of the present disclosure.

In the embodiments of the present disclosure, one of schematic structural diagrams of a display substrate provided by embodiments of the present disclosure is as shown in FIG. 2. The electrochromic structure 30 includes a plurality of electrochromic units 300. The plurality of pixel units 20 are in one-to-one correspondence to the plurality of electrochromic units 300. Transmittance of each electrochromic unit 300 is positively correlated with the brightness of the pixel unit 20, corresponding to the each electrochromic unit 300, when displaying the image. In an implementation process, one pixel unit 20 may correspond to one electrochromic unit 300, and the transmittance of the one electrochromic unit 300 is positively correlated with the brightness of the corresponding one pixel unit 20 when displaying the image. In an implementation, since the brightness of the pixel units 20 at different positions when displaying the image may be different, correspondingly, the transmittance of the electrochromic unit 300 corresponding to the pixel unit 20 at each position is adjusted accordingly, thereby realizing adjustment of the transmittance of the electrochromic units 300 corresponding to the pixel units 20 at different positions, so that the accurate adjustment of the contrast of the display substrate is realized, and the display effect of the display substrate is improved.

Figure 3:
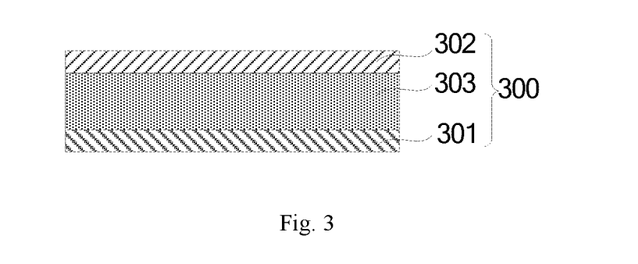
FIG. 3 is a schematic diagram of an amplified structure of an electrochromic unit in a display substrate provided by an embodiment of the present disclosure.

In the embodiments of the present disclosure, one of schematic diagrams of an amplified structure of an electrochromic unit 300 is as shown in FIG. 3. The electrochromic unit 300 includes a first electrode 301 and a second electrode 302 arranged sequentially facing away from the base substrate 10, and an electrochromic film 303 arranged between the first electrode 301 and the second electrode 302. In an implementation process, the first electrode 301 and the second electrode 302 are both transparent electrodes, and adopted materials of the transparent electrodes may be indium tin oxide or indium zinc oxide, which is not limited here. In addition, a pulse voltage may be applied to the first electrode 301 and the second electrode 302 respectively, so that transmittance of the electrochromic film 303 between the first electrode 301 and the second electrode 302 is adjusted, and the adjustment of the transmittance of the electrochromic unit 300 is realized.

Figure 4:
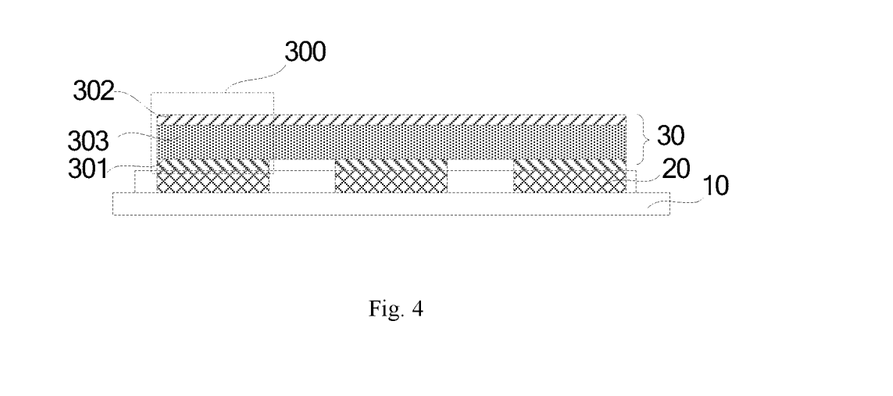
FIG. 4 is a schematic structural diagram of a first electrode as an independent electrode in a display substrate provided by an embodiment of the present disclosure.
Figure 5:
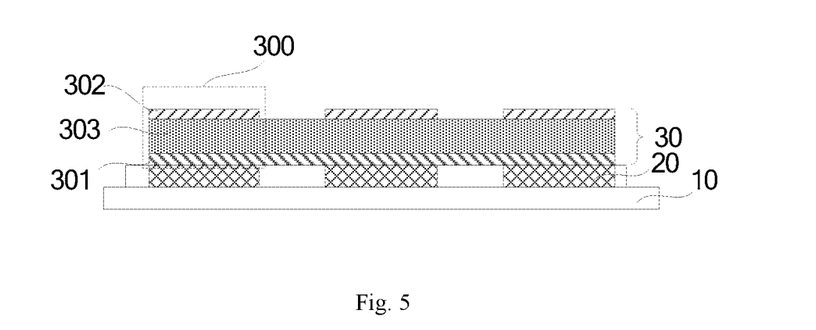
FIG. 5 is a schematic structural diagram of a second electrode as an independent electrode in a display substrate provided by an embodiment of the present disclosure.
Figure 6:
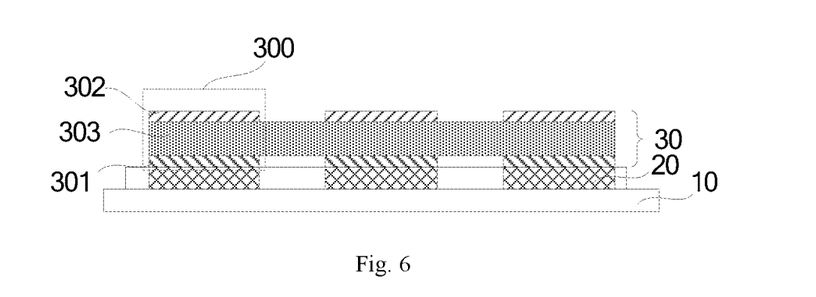
FIG. 6 is a schematic structural diagram of a first electrode and a second electrode both as independent electrodes in a display substrate provided by an embodiment of the present disclosure.

In the embodiments of the present disclosure, with reference to FIG. 4 to FIG. 6, at least one of the first electrode 301 or the second electrode 302 in one electrochromic unit 300 is independent from that/those in another electrochromic unit 300, and an orthographic projection of the independent electrode on the base substrate 10 overlaps with an orthographic projection of the corresponding pixel unit 20 on the base substrate 10. FIG. 4 is one of schematic structural diagrams of a first electrode 301 as an independent electrode in a display substrate provided by an embodiment of the present disclosure, FIG. 5 is one of schematic structural diagrams of a second electrode 302 as an independent electrode in a display substrate provided by an embodiment of the present disclosure, and FIG. 6 is one of schematic structural diagrams of a first electrode 301 and a second electrode 302 both as independent electrodes in a display substrate provided by an embodiment of the present disclosure.

In an implementation process, since the orthographic projection of the independent electrode on the base substrate 10 overlaps with the orthographic projection of the corresponding pixel unit 20 on the base substrate 10, for example, the independent electrode is arranged corresponding to a single pixel unit 20 one to one, and the single pixel unit 20 is arranged corresponding to the electrochromic structure 30 one to one, so that the independent adjustment of the transmittance of the electrochromic structure 30 corresponding to the corresponding pixel unit 20 is realized through the independent electrode, and the display contrast of the single pixel unit 20 is improved.

Figure 7:
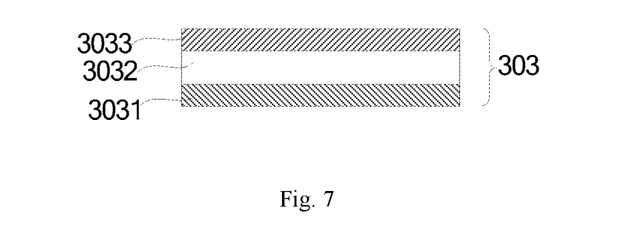
FIG. 7 is a schematic diagram of an amplified structure of an electrochromic film in a display substrate provided by an embodiment of the present disclosure.

In the embodiments of the present disclosure, one of schematic diagrams of an amplified structure of an electrochromic film 303 in a display substrate provided by an embodiment of the present disclosure is as shown in FIG. 7. The electrochromic film 303 includes an ion layer 3031, an electrochromic layer 3032 and an electrolyte layer 3033 arranged sequentially facing away from the base substrate 10.

In an implementation process, a material of the electrolyte layer 3033 may be an inorganic electrolyte, such as magnesium fluoride ($MgF_2$), calcium fluoride ($CaF_2$) and zirconium dioxide ($ZrO_2$). A material of the electrochromic layer 3032 may be an inorganic material, such as tungsten trioxide ($WO_3$) and molybdenum trioxide ($MoO_3$). A material of the electrochromic layer 3032 may further be a polymer material, such as polyaniline, five-membered heterocycle polymer and derivatives, such as pyridine and thiophene. A material of the ion layer 3031 may be titanium dioxide ($TiO_2$), which can provide enough ions, ensure a high ionic and electronic conductivity, and ensure good firmness and chemical stability.

In an implementation process, a pulse voltage is applied to the electrochromic film 303 through the first electrode 301 and the second electrode 302, electrons enter the electrochromic layer 3032 from the electrolyte layer 3033, which causes a redox reaction of the material of the electrochromic layer 3032, and thus the transmittance of the electrochromic layer 3032 is changed. In addition, in an implementation, a setting sequence among structures of the ion layer 3031, the electrochromic layer 3032 and the electrolyte layer 3033 in the electrochromic film 303 may be adjusted according to the materials actually selected by the electrolyte layer 3033 and the ion layer 3031. For example, the electrolyte layer 3033, the electrochromic layer 3032 and the ion layer 3031 are arranged sequentially facing away from the base substrate 10, of course, it may further be other settings, which is not limited here.

Figure 8:
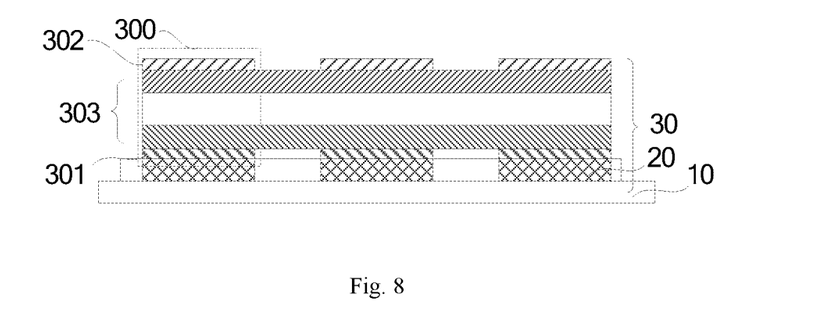
FIG. 8 is a schematic structural diagram of a display substrate provided by an embodiment of the present disclosure.

In the embodiments of the present disclosure, one of schematic structural diagrams of a display substrate provided by an embodiment of the present disclosure is as shown in FIG. 8. The electrochromic film 303 of respective electrochromic units 300 forms a whole film layer. The adjustment of the transmittance of the electrochromic film 303 in respective electrochromic units 300 is realized through the independent electrodes. Further, the contrast of the display substrate is increased, so that a manufacturing process of the electrochromic structure 30 is simplified, and a manufacturing cost of the display substrate is reduced.

Figure 9:
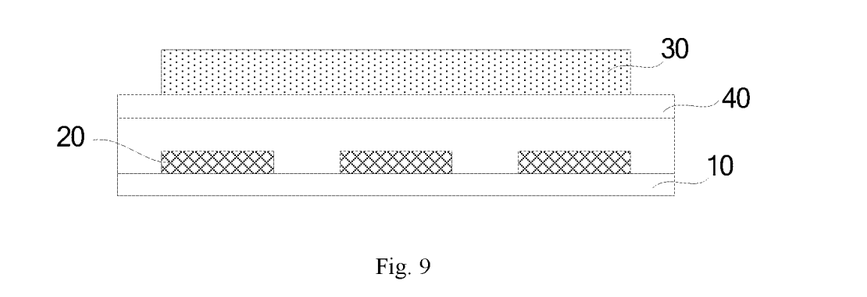
FIG. 9 is a schematic structural diagram of a display substrate provided by an embodiment of the present disclosure.

In the embodiments of the present disclosure, one of schematic structural diagrams of a display substrate provided by an embodiment of the present disclosure is as shown in FIG. 9. The plurality of pixel units 20 are of a liquid crystal display structure. The display substrate further includes a metal linear polarizer 40, and the metal linear polarizer 40 is located between the liquid crystal display structure and the electrochromic structure 30.

In an implementation process, the display substrate may be a panel based on a liquid crystal display, the metal linear polarizer 40 may modulate light from the liquid crystal display structure, and may further fully reflect the ambient light, thereby realizing the mirror function of the display substrate. Further, in addition to the above structure, other structures of the display substrate based on the liquid crystal display are the same as those of the related art, which will not be detailed here.

Figure 10:
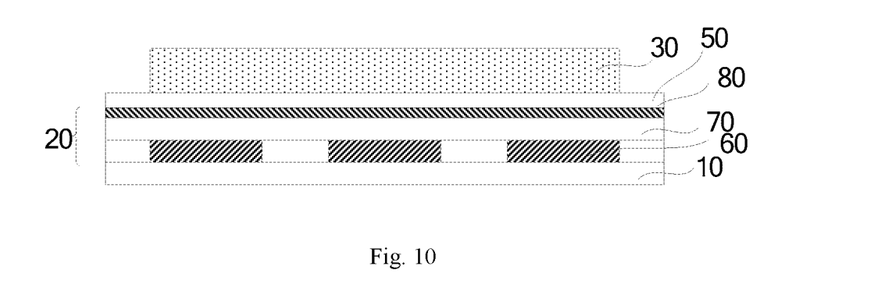
FIG. 10 is a schematic structural diagram of a display substrate provided by an embodiment of the present disclosure.

In the embodiments of the present disclosure, one of schematic structural diagrams of a display substrate provided by an embodiment of the present disclosure is as shown in FIG. 10. The plurality of pixel units 20 are OLED devices, the display substrate further includes an encapsulation layer 50 located on a surface of the OLED devices facing away from the base substrate 10, and the electrochromic structure 30 is located on one side of the encapsulation layer 50 facing away from the base substrate 10.

In an implementation process, the display substrate may be a panel based on an OLED, the plurality of pixel units 20 are the OLED devices, and the OLED device includes an anode 60, a light emitting layer 70 and a cathode 80 arranged in a stacked manner. The anode 60 or the cathode 80 may be used as a reflecting electrode, through which the ambient light is fully reflected, thereby realizing the mirror function of the display substrate.

In addition, the encapsulation layer 50 located on the surface of the OLED devices facing away from the base substrate 10 can effectively avoid damage of external water and oxygen to the OLED devices. The encapsulation layer 50 includes a first inorganic layer, an organic layer and a second inorganic layer arranged sequentially in a stacked manner. A material of the organic layer may be poly-p-xylylene, and materials of the first inorganic layer and the second inorganic layer may be silicon nitride, silicon dioxide, etc. In an implementation process, in addition to the above structure, other structures of the display substrate based on the OLED are the same as those of the related art, which will not be detailed here.

In the embodiments of the present disclosure, when the display substrate is in the display function, the transmittance of the electrochromic structure 30 can be adjusted in real time, so as to ensure that the display substrate has a high contrast at each display moment. Correspondingly, when the display substrate is switched from the display function to the mirror function, the transmittance of the electrochromic structure 30 at the current moment may be adjusted to an initialization state with a high transmittance and the same value. For example, in the initialization state, the transmittance of each electrochromic structure 30 is 90%. In this way, the display substrate can realize the mirror function of the display substrate when the metal linear polarizer 40 or the reflecting electrode reflects the external ambient light. In an implementation process, if the display substrate is in the mirror function currently, for example, the transmittance of each electrochromic structure 30 is 90%. When the display substrate is switched from the mirror function to the display function, the transmittance of the electrochromic structure 30 at different moments may be adjusted on the basis of 90%, so that the transmittance of the electrochromic structure 30 under the display function is adjusted in real time, and the contrast of the display substrate is increased.

Figure 11:
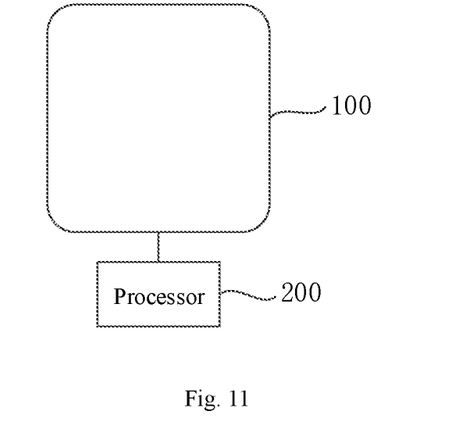
FIG. 11 is a schematic structural diagram of a display apparatus provided by an embodiment of the present disclosure.

Based on the same inventive concept, embodiments of the present disclosure further provide a display apparatus. A schematic structural diagram of the display apparatus is as shown in FIG. 11. The display apparatus includes a display substrate 100 and a processor 200. The processor 200 is configured to:

receive an image;

determine brightness of a plurality of pixel units when displaying the image; and determine a pulse voltage applied to an electrochromic structure according to the brightness, and adjust transmittance of the electrochromic structure under an action of the pulse voltage.

Since the principle for solving problems of the display apparatus is similar to that of the above display substrate 100, the implementation of the display apparatus may refer to the implementation of the above display substrate 100, and repetitions will not be made.

In an implementation process, the display apparatus provided by the embodiments of the present disclosure may be a mobile phone, a tablet computer, a television, a display, a laptop, a digital photo frame, a navigator and any product or component with a display function. Other essential components of the mirror display apparatus shall be understood by those of ordinary skill in the art, and are omitted herein and also shall not become a restriction to the present disclosure.

Figure 12:
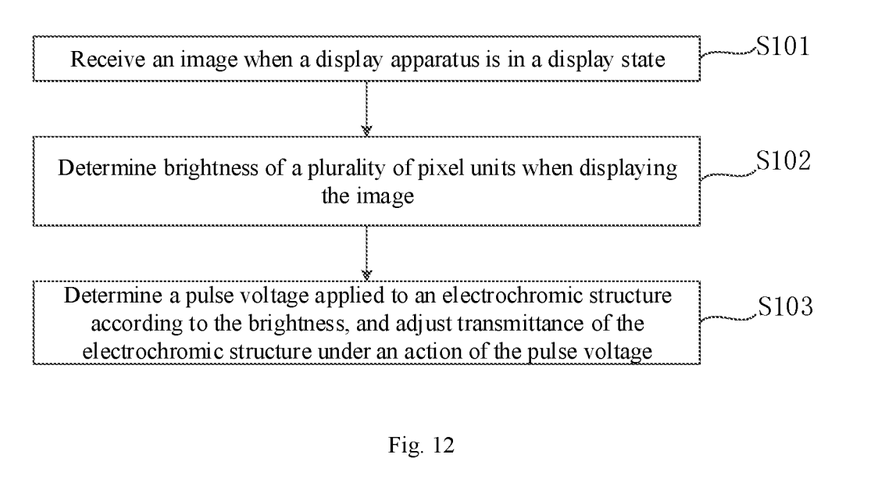
FIG. 12 is a flow chart of a display method of a display apparatus provided by an embodiment of the present disclosure.

Based on the same inventive concept, as shown in FIG. 12, embodiments of the present disclosure further provide a display method of the above display apparatus, including the following steps.

S101, an image is received when the display apparatus is in a display state.

In an implementation process, the image may be a color image input by a signal source. After receiving the image, the display apparatus displays the image.

S102, brightness of a plurality of pixel units when displaying the image is determined.

In an implementation, the brightness of the plurality of pixel units 20 corresponding to the electrochromic structure 30 when displaying the image is determined. In an implementation, the brightness corresponding to each pixel unit 20 when displaying the image may be determined, or the average brightness of the plurality of pixel units 20 when displaying the image may be determined.

S103, a pulse voltage applied to an electrochromic structure is determined according to the brightness, and transmittance of the electrochromic structure is adjusted under an action of the pulse voltage.

In an implementation process, at any moment, the transmittance of the electrochromic structure 30 at the current moment may be adjusted according to the brightness of the plurality of pixel units 20 corresponding to the electrochromic structure 30 when displaying the image, so that the transmittance of the electrochromic structure 30 is adjusted in real time. In addition, the transmittance is positively correlated with the brightness. That is, at different moments, the greater the brightness of the plurality of pixel units 20 when displaying the image, the greater the transmittance of the electrochromic structure 30 is adjusted, and correspondingly, the brighter the plurality of pixel units 20 when displaying the image. On the contrary, at different moments, the smaller the brightness of the plurality of pixel units 20 when displaying the image, the smaller the transmittance of the electrochromic structure 30 is adjusted, and correspondingly, the darker the plurality of pixel units 20 when displaying the image. Therefore, the contrast of the display apparatus when displaying the image is increased.

Figure 13:
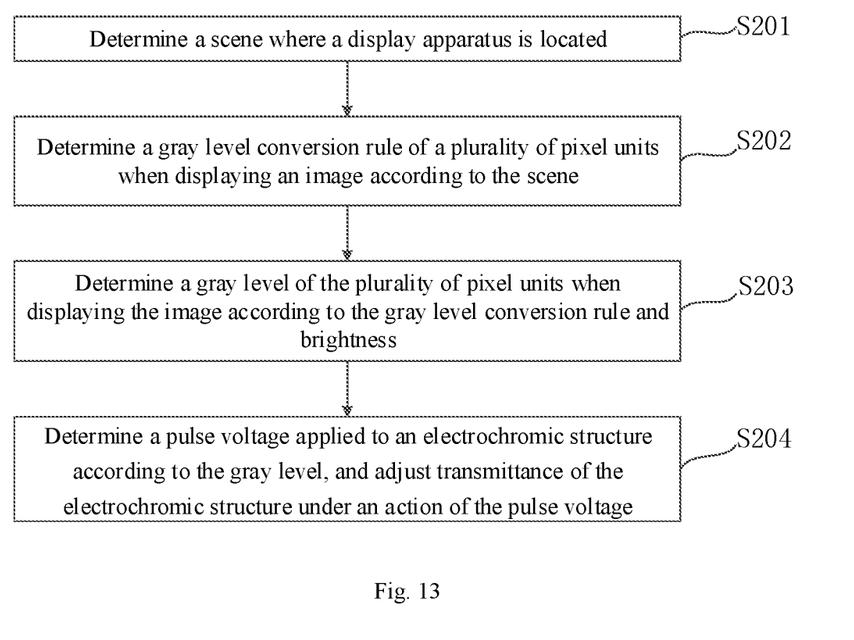
FIG. 13 is a flow chart of step S103 in a display method of a display apparatus provided by an embodiment of the present disclosure.

In the embodiments of the present disclosure, as shown in FIG. 13, step S103: the pulse voltage applied to the electrochromic structure is determined according to the brightness, and the transmittance of the electrochromic structure is adjusted under the action of the pulse voltage, includes the following steps.

S201, a scene where the display apparatus is currently located is determined.

S202, a gray level conversion rule of the plurality of pixel units when displaying the image is determined according to the scene.

S203, a gray level of the plurality of pixel units when displaying the image is determined according to the gray level conversion rule and the brightness.

S204, a pulse voltage applied to the electrochromic structure is determined according to the gray level, and transmittance of the electrochromic structure is adjusted under the action of the pulse voltage.

In an implementation process, an implementation process of step S201 to step S204 is as follows.

First, the scene where the display apparatus is currently located is determined. In practical applications, the scene may be an indoor scene or an outdoor scene when indoor and outdoor are taken as a scene division standard; and the scene may be a night scene or a daytime scene when an environment brightness is taken as the scene division standard. In practical applications, the scene may be a scene artificially set by a user, or a scene determined according to obtained environment parameter information. For example, brightness range of an environment light brightness where the display apparatus is located is detected through a light sensor, and thus the scene where the display apparatus is currently located is determined. Of course, those skilled in the art may further adopt other methods to determine the scene where the display apparatus is currently located according to the actual needs, which is not limited here.

After the scene where the display apparatus is currently located is determined, the gray level conversion rule of the plurality of pixel units 20 when displaying the image is determined according to the scene. In an implementation process, a corresponding relationship between the scene and the gray level conversion rule may be established in advance, and after the scene where the display apparatus is currently located is determined, the gray level conversion rule corresponding to the scene may be determined according to the corresponding relationship. Then, the gray level of the plurality of pixel units 20 when displaying the image is determined according to the gray level conversion rule and the brightness. A range of the gray level is [0,100]. Then, a voltage with a corresponding value is applied to the electrochromic structure 30 according to the gray level, and the transmittance of the electrochromic structure 30 is adjusted.

In an implementation process, a corresponding relationship between the gray level and the voltage value applied to the electrochromic structure 30 may be established in advance, so that a voltage with the corresponding value is applied to two electrodes of the electrochromic structure 30 according to the corresponding relationship between the gray level and the voltage, thereby realizing the adjustment of the transmittance of the electrochromic structure 30. For example, if a positive voltage is applied to the electrochromic structure 30, the transmittance of the electrochromic structure 30 is reduced; and for another example, if a negative voltage is applied to the electrochromic structure 30 according to the corresponding relationship between the gray level and the voltage, the transmittance of the electrochromic structure 30 is increased.

In the embodiments of the present disclosure, step S202: the gray level conversion rule of the plurality of pixel units when displaying the image is determined according to the scene, the determined gray level conversion rule mainly includes, but is not limited to the following three cases.

In a first case, if the scene is an indoor environment, the gray level conversion rule is:

$0.299R+0.587G+0.114B=GRAY(Y)$, where, R represents brightness of red sub-pixels included by the plurality of pixel units 20, G represents brightness of green sub-pixels included by the plurality of pixel units 20, B represents brightness of blue sub-pixels included by the plurality of pixel units 20, and GRAY(Y) represents the gray level of the plurality of pixel units 20 when displaying the image. In practical applications, in the indoor environment, the gray level conversion rule that conforms to a psychological formula is adopted, which is more consistent with the user's visual psychology, the gray level of the plurality of pixel units 20 when displaying the image is determined by the gray level conversion rule and the brightness. Finally, the voltage with the corresponding value is applied to the electrochromic structure 30 according to the gray level, and the transmittance of the electrochromic structure 30 is adjusted, so that a good display contrast is ensured, and the display effect of the mirror display apparatus is improved.

In a second case, if the scene is an outdoor environment, the gray level conversion rule is:

$[\max(R,G,B)+\min(R,G,B)]/2=GRAY(Y)$, where, R represents brightness of red sub-pixels included by the plurality of pixel units 20, G represents brightness of green sub-pixels included by the plurality of pixel units 20, B represents brightness of blue sub-pixels included by the plurality of pixel units 20, and GRAY(Y) represents the gray level of the plurality of pixel units 20 when displaying the image. In practical applications, in the outdoor environment, the gray level of the plurality of pixel units 20 when displaying the image is determined by adopting the gray level conversion rule with brightness priority and the brightness. Finally, the voltage with the corresponding value is applied to the electrochromic structure 30 according to the gray level, and the transmittance of the electrochromic structure 30 is adjusted, so that the good display contrast is ensured, and the display effect of the mirror display apparatus is improved.

In a third case, when the scene is determined by daytime and night, and if the scene is a night environment, the gray level conversion rule is:

0.21R+0.72G+0.07B=GRAY(Y), where, R represents brightness of red sub-pixels included by the plurality of pixel units 20, G represents brightness of green sub-pixels included by the plurality of pixel units 20, B represents brightness of blue sub-pixels included by the plurality of pixel units 20, and GRAY(Y) represents the gray level of the plurality of pixel units 20 when displaying the image. In practical applications, in the night environment, the gray level of the plurality of pixel units 20 when displaying the image is determined by adopting the gray level conversion rule based on weight and the brightness. Finally, the voltage with the corresponding value is applied to the electrochromic structure 30 according to the gray level, and the transmittance of the electrochromic structure 30 is adjusted, so that the good display contrast is ensured, and the display effect of the display apparatus is improved.

In addition, in practical applications, average brightness conversion may further be adopted as the gray level conversion rule. The gray level conversion rule is: (R+G+B)/3=GRAY(Y), where, R represents brightness of red sub-pixels included by the plurality of pixel units 20, G represents brightness of green sub-pixels included by the plurality of pixel units 20, B represents brightness of blue sub-pixels included by the plurality of pixel units 20, and GRAY(Y) represents the gray level of the plurality of pixel units 20 when displaying the image. In an implementation process, those skilled in the art may adopt corresponding gray conversion rules according to the actual needs, so that the flexible adjustment of the transmittance of the electrochromic structure 30 is realized, and the use performance of the display apparatus is improved.

Although the preferred embodiments of the present disclosure have been described, those skilled in the art can make additional changes and modifications to these embodiments once they know the basic creative concept. So the appended claims are intended to be construed to include the preferred embodiments and all changes and modifications that fall within the scope of the present disclosure.

Obviously, those skilled in the art can make various modifications and variations to the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

What is claimed is:

1. A display substrate, comprising:
   a base substrate;
   a plurality of pixel units on the base substrate; and
   an electrochromic structure on a side of the plurality of pixel units facing away from the base substrate;
   wherein when the display substrate is in a mirror state, transmittance of the electrochromic structure is in an initialization state with a preset value;
   when the display substrate is in a display state, the transmittance of the electrochromic structure is positively correlated with brightness of the plurality of pixel units when displaying an image;
   the electrochromic structure comprises a plurality of electrochromic units;
   the plurality of pixel units are in one-to-one correspondence to the plurality of electrochromic units;
   transmittance of each electrochromic unit is positively correlated with brightness of a pixel unit, corresponding to the each electrochromic unit, when displaying the image;
   the electrochromic unit comprises: a first electrode and a second electrode arranged sequentially facing away from the base substrate; and an electrochromic film arranged between the first electrode and the second electrode;
   the electrochromic film comprises: an ion layer, an electrochromic layer, and an electrolyte layer, arranged sequentially facing away from the base substrate.

2. The display substrate of claim 1, wherein the plurality of pixel units are of a liquid crystal display structure, the display substrate further comprises a metal linear polarizer, and the metal linear polarizer is located between the liquid crystal display structure and the electrochromic structure.

3. The display substrate of claim 1, wherein the plurality of pixel units are OLED devices, the display substrate further comprises an encapsulation layer located on a surface of the OLED devices facing away from the base substrate, and the electrochromic structure is located on a side of the encapsulation layer facing away from the base substrate.

4. A display apparatus, comprising the display substrate of claim 1, and a processor, wherein the processor is configured to:
   receive the image;
   determine brightness of the plurality of pixel units when displaying the image; and
   determine a pulse voltage applied to the electrochromic structure according to the brightness, and adjust transmittance of the electrochromic structure under an action of the pulse voltage.

5. A display method of the display apparatus according to claim 4, comprising:
   receiving the image when the display apparatus is in the display state;
   determining the brightness of the plurality of pixel units when displaying the image; and
   determining the pulse voltage applied to the electrochromic structure according to the brightness, and adjusting the transmittance of the electrochromic structure under the action of the pulse voltage.

6. The display method of claim 5, wherein said adjusting the transmittance of the electrochromic structure, comprises:
   determining a scene where the display apparatus is located;
   determining a gray level conversion rule of the plurality of pixel units when displaying the image according to the scene;
   determining a gray level of the plurality of pixel units when displaying the image according to the gray level conversion rule and the brightness; and
   determining the pulse voltage applied to the electrochromic structure according to the gray level, and adjusting transmittance of the electrochromic structure under the action of the pulse voltage.

7. The display method of claim 6, wherein said determining the gray level conversion rule of the plurality of pixel units when displaying the image according to the scene, comprises:

when the scene is an indoor environment, the gray level conversion rule is:

$$0.299R+0.587G+0.114B=\text{GRAY}(Y);$$

where, R represents brightness of red sub-pixels comprised by the plurality of pixel units, G represents brightness of green sub-pixels comprised by the plurality of pixel units, B represents brightness of blue sub-pixels comprised by the plurality of pixel units, and GRAY(Y) represents the gray level of the plurality of pixel units when displaying the image.

8. The display method of claim 6, wherein said determining the gray level conversion rule of the plurality of pixel units when displaying the image according to the scene, comprises:

when the scene is an outdoor environment, the gray level conversion rule is:

$$[\max(R,G,B)+\min(R,G,B))/2=\text{GRAY}(Y);$$

where, R represents brightness of red sub-pixels comprised by the plurality of pixel units, G represents brightness of green sub-pixels comprised by the plurality of pixel units, B represents brightness of blue sub-pixels comprised by the plurality of pixel units, and GRAY(Y) represents the gray level of the plurality of pixel units when displaying the image.

9. The display method of claim 6, wherein said determining the scene where the display apparatus is located, comprises:

determining a scene artificially set for the display apparatus; or determining a scene where the display apparatus is located according to environment parameter information where the display apparatus is located.

10. The display method of claim 6, wherein said determining the gray level conversion rule of the plurality of pixel units when displaying the image according to the scene, comprises:

when the scene is a night environment, the gray level conversion rule is:

$$0.21R+0.72G+0.07B=\text{GRAY}(Y);$$

where, R represents brightness of red sub-pixels comprised by the plurality of pixel units, G represents brightness of green sub-pixels comprised by the plurality of pixel units, B represents brightness of blue sub-pixels comprised by the plurality of pixel units, and GRAY(Y) represents the gray level of the plurality of pixel units when displaying the image.

11. The display method of claim 6, wherein average brightness conversion is adopted as the gray level conversion rule, and the gray level conversion rule is:

$$(R+G+B)/3=\text{GRAY}(Y);$$

where, R represents brightness of red sub-pixels comprised by the plurality of pixel units, G represents brightness of green sub-pixels comprised by the plurality of pixel units, B represents brightness of blue sub-pixels comprised by the plurality of pixel units, and GRAY(Y) represents the gray level of the plurality of pixel units when displaying the image.

* * * * *